US008718964B2

(12) United States Patent
Xu

(10) Patent No.: US 8,718,964 B2
(45) Date of Patent: May 6, 2014

(54) METHOD AND SYSTEM FOR CALIBRATING CURRENT SENSORS

(76) Inventor: Wilsun Xu, Edmonton (CA)

( * ) Notice: Subject to any disclaimer, the term of this patent is extended or adjusted under 35 U.S.C. 154(b) by 384 days.

(21) Appl. No.: 13/078,236

(22) Filed: Apr. 1, 2011

(65) Prior Publication Data

US 2012/0253726 A1 Oct. 4, 2012

(51) Int. Cl.
G01C 19/00 (2013.01)
(52) U.S. Cl.
USPC .................................... 702/104
(58) Field of Classification Search
USPC ........................................ 702/104
See application file for complete search history.

(56) References Cited

U.S. PATENT DOCUMENTS

| 4,216,367 | A | * | 8/1980 | Risberg | ............ | 219/132 |
| 5,438,256 | A | | 8/1995 | Thuries et al. | | |
| 5,473,244 | A | | 12/1995 | Libove et al. | | |
| 2006/0085144 | A1 | * | 4/2006 | Slota et al. | ............ | 702/57 |
| 2011/0074382 | A1 | | 3/2011 | Patel | | |
| 2012/0072143 | A1 | | 3/2012 | Yogeeswaran et al. | | |

OTHER PUBLICATIONS

J. T. Scoville and P.I. Peterson, "A low-cost multiple hall probe current transducer", Review of Scientific Instrumentation, vol. 62, No. 3, pp. 755-760, 1991.

P. Ripka et al., "Precise DC Current Sensors", IEEE Instrumentation and Measurement Technology Conference, pp. 1479-1483, 1996.

G. D'Antona et al., "Processing Magnetic Sensor Array Data for AC Current Measurement in Multiconductor Systems", IEEE Transactions on Instrumentation and Measurement, vol. 50, No. 5, pp. 1289-1295, 2001.

* cited by examiner

Primary Examiner — Stephen Cherry
(74) Attorney, Agent, or Firm — Brion Raffoul

(57) ABSTRACT

Methods and devices for establishing the relationships between the conductor currents and sensor outputs for cases where the geometric parameters of the conductors and sensors are unknown. The methodology involves a sensor calibrator. This device is connected to the conductors at a location downstream of a number of current measuring devices or current sensors. The calibrator draws specific currents from the conductors for a short period in an automated manner. The characteristics of the currents drawn by the calibrator such as the magnitude and frequency of the currents are known to the processing unit for the sensors through means such as communications. The processing unit uses these known currents to establish the relationship between the conductor currents and its sensed quantities. This process may take a few seconds. Once the relationship is established, the sensors can start to "measure" the conductor currents by calculating them using that relationship and its sensed quantities.

20 Claims, 5 Drawing Sheets

METHOD AND SYSTEM FOR CALIBRATING CURRENT SENSORS

TECHNICAL FIELD

The present invention relates to current measurement. More specifically, the present invention relates to methods, systems, and apparatus for non-invasively measuring current passing through multiple conductors.

BACKGROUND OF THE INVENTION

The traditional approach to measure the currents of power conductors is to install a current sensor such as a current transformer or a clamp-on Hall-effect sensor to each conductor. This approach has been practiced by electrical industry for years. While it can provide accurate measurement of the conductor current, the approach has a major limitation: the sensor must be clamped-on to each conductor for measurement. If the conductors cannot be separated or cannot be accessed individually, it is not possible to measure the conductor current using such techniques. Since cases involving bundled conductors are not uncommon, industry has a strong need for techniques that can measure currents in a group of difficult-to-separate conductors. A classical example of such a need is to measure the currents in conductors that are enclosed in an electrical conduit. Another example is to measure the currents in a multi-conductor cable such as the Romex cable. A third example involves the measurement of currents in overhead power lines without using expensive, high voltage, clamp-on current transformers.

In recent years, a new current measurement technique that has the potential to overcome the above shortcoming has emerged. The technique involves the use of an array of magnetic field sensing elements placed in close proximity to the conductors of interest. The idea is to calculate the conductor currents based on the magnetic fields measured by the sensing elements. J. T. Scoville and P. I. Peterson, for example, presented an idea of using arrays of magnetic field sensors for the purposes of current sensing and of rejecting background magnetic field noises ("A low-cost multiple hall probe current transducer" Review of Scientific Instrumentation Vol 62, no. 3, pp. 755-760, 1991). In their article ("Precise DC current sensors" IEEE Instrumentation and Measurement Technology Conference pp. 1479-1483, 1996), P. Ripka, P. Kejic, P. Kaspar, and K. Draxler also proposed the sensor array method for DC current measurement but different magnetic field sensors were used. The article by G. D'Antona, L. D. Rienzo, R. Ottoboni, and A. Manara, ("Processing Magnetic Sensor Array Data for AC Current Measurement in Multiconductor Systems," IEEE Transactions On Instrumentation And Measurement. Vol 50, no. 5, pp. 1289-1295, 2001.) proposed to use the finite element method to determining the relationship between the conductor currents and sensed magnetic fields so that more accurate current can be measured. The patented ideas in the area of sensor array based current measurement method include U.S. Pat. Nos. 5,438,256 and 5,473,244. U.S. Pat. No. 5,438,256 disclosed a method to measure currents in overhead power lines using magnetic field sensor array deployed at the ground level. U.S. Pat. No. 5,473,244 proposed a method to determine the currents in the conductors of Romex cables which are commonly used in homes.

All of the above techniques need to solve a common problem before they can be applied for current measurement. They need to establish the relationship between the currents to be determined and the magnetic fields measured. This relationship is a function of the geometric locations of the conductors and sensors, i.e. the layout of conductors and sensors. If such geometric information is available, the relationship can be established. For example, U.S. Pat. No. 5,438,256 and the technical articles cited earlier use the known geometric parameters of the conductors and sensors to establish the relationship and thereby to calculate the conductor currents using the established relationships and the sensed quantities. Unfortunately, for cases where the geometric parameters are unknown, such as the Romex cable case, it has become very difficult to measure the current using the sensor array technique since the relationship cannot be established. U.S. Pat. No. 5,473,244 proposed one idea to solve the problem. It involves the use of redundant sensors and an optimization algorithm. The algorithm is to figure out a set of current values such that the errors between the calculated magnetic fields and sensed magnetic fields are minimized. While this technique is theoretically sound, there is no guarantee to get the correct results since there are multiple local minimal solutions for the optimization problem.

SUMMARY OF INVENTION

The present invention provides methods and devices that can establish the relationships between the conductor currents and sensor outputs for cases where the geometric parameters of the conductors and sensors are unknown. The methodology involves a sensor calibrator. This device is connected to the conductors at a location downstream of a number of current measuring devices or current sensors. The calibrator draws specific currents from the conductors for a short period in an automated manner. The characteristics of the currents drawn by the calibrator such as the magnitude and frequency of the currents are known to the processing unit for the sensors through means such as communications. The processing unit uses these known currents to establish the relationship between the conductor currents and its sensed quantities. This process may take a few seconds. Once the relationship is established, the sensors can start to "measure" the conductor currents by calculating them using that relationship and its sensed quantities.

In a first aspect, the present invention provides a system for calibrating an electrical measuring device which measures electrical current moving through at least one conductor, the system comprising:

a calibration device for drawing electrical current from said at least one conductor, said device adjusting electrical current it draws from said at least one conductor in a controlled manner, said device also measuring changes in said electrical current it draws from said at least one conductor, said device being electrically coupled to said at least one conductor downstream of a current measuring device;

a processing unit for calculating calibration values, said calibration values being calculated based on said changes in electrical current drawn by said device and data relating to electromagnetic effects caused by currents in said at least one conductor, said electromagnetic effects being measured when said changes in electrical current drawn by said device occur wherein said device communicates its measurements to said calculation module.

In a second aspect, the present invention provides a method for calibrating an electronic current measuring device which measures electrical current passing through at least one conductor, the method comprising:

a) locating a calibration device adjacent said at least one conductor, said calibration device being for drawing electrical current from said at least one conductor, said calibration device also being for adjusting, in a controlled manner, said electrical current being drawn from said at least one conductor b) adjusting said electrical current drawn by said calibration device from said at least one conductor and c) providing a measurement of said electrical current adjusted in step b) to a processing unit d) concurrent with step b), collecting data relating to electromagnetic effects from the sensing device, said electromagnetic effects being caused by said electrical current in said at least one conductor e) repeating steps b) to d) until sufficient measurements have been obtained f) calculating calibration values based on said measurements and data obtained in steps b) and d).

BRIEF DESCRIPTION OF THE DRAWINGS

The embodiments of the present invention will now be described by reference to the following figures, in which identical reference numerals in different figures indicate identical elements and in which.

DETAILED DESCRIPTION OF THE INVENTION

The present invention provides a calibration method for use with current and future current sensing methodologies. The calibration method uses a sensor calibrator that is connected to the conductors at a location downstream of sensors that measure the effects of current flow in at least one conductor. The calibration method may, of course, be used with multiple conductors. The calibrator draws specific currents from the conductors for a short period in an automated manner. The characteristics of the currents drawn by the calibrator such as the magnitude and frequency of the currents are known to the sensors through communications or other means. A processing unit uses these known currents to establish the relationship between the conductor currents and the measured effects of current flow. This calibration process determines this relationship and once this relationship is established, i.e. the calibration process is completed, the sensors can start to "measure" the conductor currents by calculating the currents using that relationship and its sensed quantities—the effects of current flow in the conductors. For the disclosed invention, the calibrator can be any current drawing devices downstream of the current effect measuring sensors as long as the calibrator draws specific currents for a short period and the parameters of the currents drawn are made known to the processing portion of the sensors. Various methods may be used to notify the processing unit of the currents drawn by the sensor calibrator. One possible method is through the use of pre-agreed current characteristics and another is through communication between the sensor calibrator and the processing unit. With this arrangement, the sensors are capable of measuring currents in any unknown conductor configuration and arbitrary sensor layout.

The disclosed is based on well-established laws of physics. According to electromagnetic theory, a current carrying conductor will produce a magnetic field in its surroundings. The strength of the magnetic field at a point in space (i.e. the sensing point) is in proportion to the current and is inversely proportional to the distance between that point and the conductor. This relationship can be written as $$B(t)=ki(t)$$

where B(t) is the field strength at a particular direction and location in space at instant t. i(t) is the current of the conductor at time t. k shows that B is in proportional to i. If there are multiple parallel conductors, the field strength in a particular direction is the vector summation of the fields produced by the various conductors:

$$B(t)=k_1 i_1(t)+k_2 i_2(t)+k_3 i_3(t)$$

The above equation assumes there are three conductors. This can be extended to n parallel conductors (where n is 1, 2, 3, 4 . . . ). The vector summation is not expressed explicitly since the equation is a projection of the fields on the direction sensed by the sensor.

Figure 1:
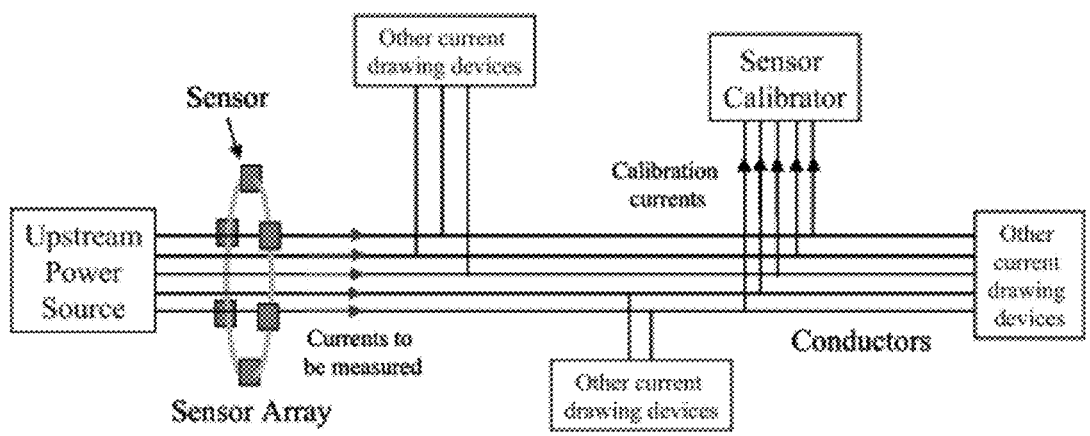
FIG. 1 illustrates a sensor array with an automated calibrator according to one aspect of the invention.
Figure 2:
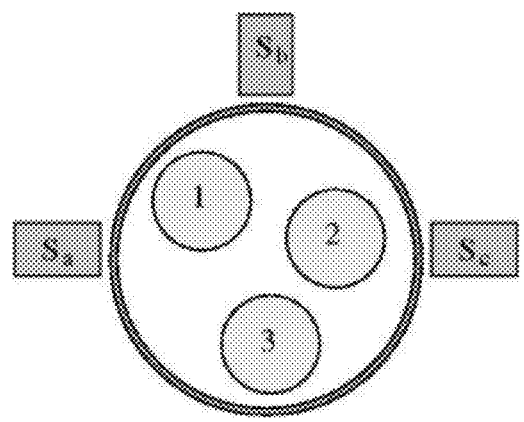
FIG. 2 illustrates 3 sensors arranged outside of a Romex cable housing 3 conductors.

If multiple sensors in the space are placed near the conductors as shown in FIG. 2, the following equation can be established:

$$B_a(t)=k_{a1}i_1(t)+k_{a2}i_2(t)+k_{a3}i_{a3}(t)$$

$$B_b(t)=k_{b1}i_1(t)+k_{b2}i_2(t)+k_{b3}i_{b3}(t)$$

$$B_c(t)=k_{c1}i_1(t)+k_{c2}i_2(t)+k_{c3}i_{c3}(t)$$

where subscripts a, b and c represent sensors a, b and c. The matrix expression of the equation is:

$$\begin{bmatrix} B_a(t) \\ B_b(t) \\ B_c(t) \end{bmatrix} = \begin{bmatrix} k_{a1} & k_{a2} & k_{a3} \\ k_{b1} & k_{b2} & k_{b3} \\ k_{c1} & k_{c2} & k_{c3} \end{bmatrix} \begin{bmatrix} i_1(t) \\ i_2(t) \\ i_3(t) \end{bmatrix}$$

It can be seen that if we know the coefficient matrix [K], we can determine the currents from the sensed magnetic field strengths according to the following equation:

$$\begin{bmatrix} i_1(t) \\ i_2(t) \\ i_3(t) \end{bmatrix} = \begin{bmatrix} k_{a1} & k_{a2} & k_{a3} \\ k_{b1} & k_{b2} & k_{b3} \\ k_{c1} & k_{c2} & k_{c3} \end{bmatrix}^{-1} \begin{bmatrix} B_a(t) \\ B_b(t) \\ B_c(t) \end{bmatrix}$$

The laws of physics further state that, if a small coil is placed at a point in space, a voltage will be induced in the coil when the conductor currents vary. Assuming that the conductor currents vary sinusoidally with a single frequency ω, voltages will be induced in coils a, b and c placed in spaces near the conductor. The relationship can be expressed as:

$$\begin{bmatrix} V_a(\omega) \\ V_b(\omega) \\ V_c(\omega) \end{bmatrix} = \begin{bmatrix} k_{a1}(\omega) & k_{a2}(\omega) & k_{a3}(\omega) \\ k_{b1}(\omega) & k_{b2}(\omega) & k_{b3}(\omega) \\ k_{c1}(\omega) & k_{c2}(\omega) & k_{c3}(\omega) \end{bmatrix} \begin{bmatrix} i_1(\omega) \\ i_2(\omega) \\ i_3(\omega) \end{bmatrix}$$

where Va, Vb and Vc are voltages induced in coils a, b, and c in the form of phasors. Again, if we know the coefficient matrix [K(ω)], we can calculate the current phasors from the measured induced voltages according to the following equation:

$$\begin{bmatrix} i_1(\omega) \\ i_2(\omega) \\ i_3(\omega) \end{bmatrix} = \begin{bmatrix} k_{a1}(\omega) & k_{a2}(\omega) & k_{a3}(\omega) \\ k_{b1}(\omega) & k_{b2}(\omega) & k_{b3}(\omega) \\ k_{c1}(\omega) & k_{c2}(\omega) & k_{c3}(\omega) \end{bmatrix}^{-1} \begin{bmatrix} V_a(\omega) \\ V_b(\omega) \\ V_c(\omega) \end{bmatrix}$$

So far, the above illustrates that the relationship between the conductor currents $\{i_1, i_2, i_3\}$ and the quantities sensed by sensors, $\{B_a, B_b, B_c\}$ and $\{V_a, V_b, V_c\}$, placed near the conductors in both time and frequency domain. Since many different sensors could be used, we define the sensed quantities arising from current flow as vector [S]. As a result, the following general relationship can be established:

$$[S] = f([I])$$

where $[S]=[S_a, S_b, S_c, S_d \ldots]'$ is the output of a array of sensors labeled as a, b, c, d . . . ; $[I]=[I_1, I_2, I_3, I_4 \ldots]'$ represents the currents of the conductors 1, 2, 3 and 4 . . . . [S] and [I] can be either time-domain quantities or frequency-domain quantities. For sensors whose outputs are linearly related to the conductor currents the above relationship can be simplified as $$[S] = [K][I]$$

Note that the above relationships are fixed (i.e. [K] is constant) if the positions of the sensors and conductors are fixed. Once the relationships are known, we can determine the currents according to the following equations:

$$[I] = f^{-1}([S]) \text{ or } [I] = [K]^{-1}[S]$$

It can be seen that establishing the relationship between the sensor outputs and the conductor currents is a critical step for measuring the conductor currents. The present invention discloses an automated scheme to establish this relationship. The scheme involves the use of a device that draws currents of known characteristics. These characteristics are communicated or may be previously known to the sensors. The processing unit then solves for the relationship based on the communicated currents and the sensed quantities of the effects arising from the current flow. There are many ways to implement this scheme, the preferred embodiments are shown in FIG. 3 and explained below.

Figure 3:
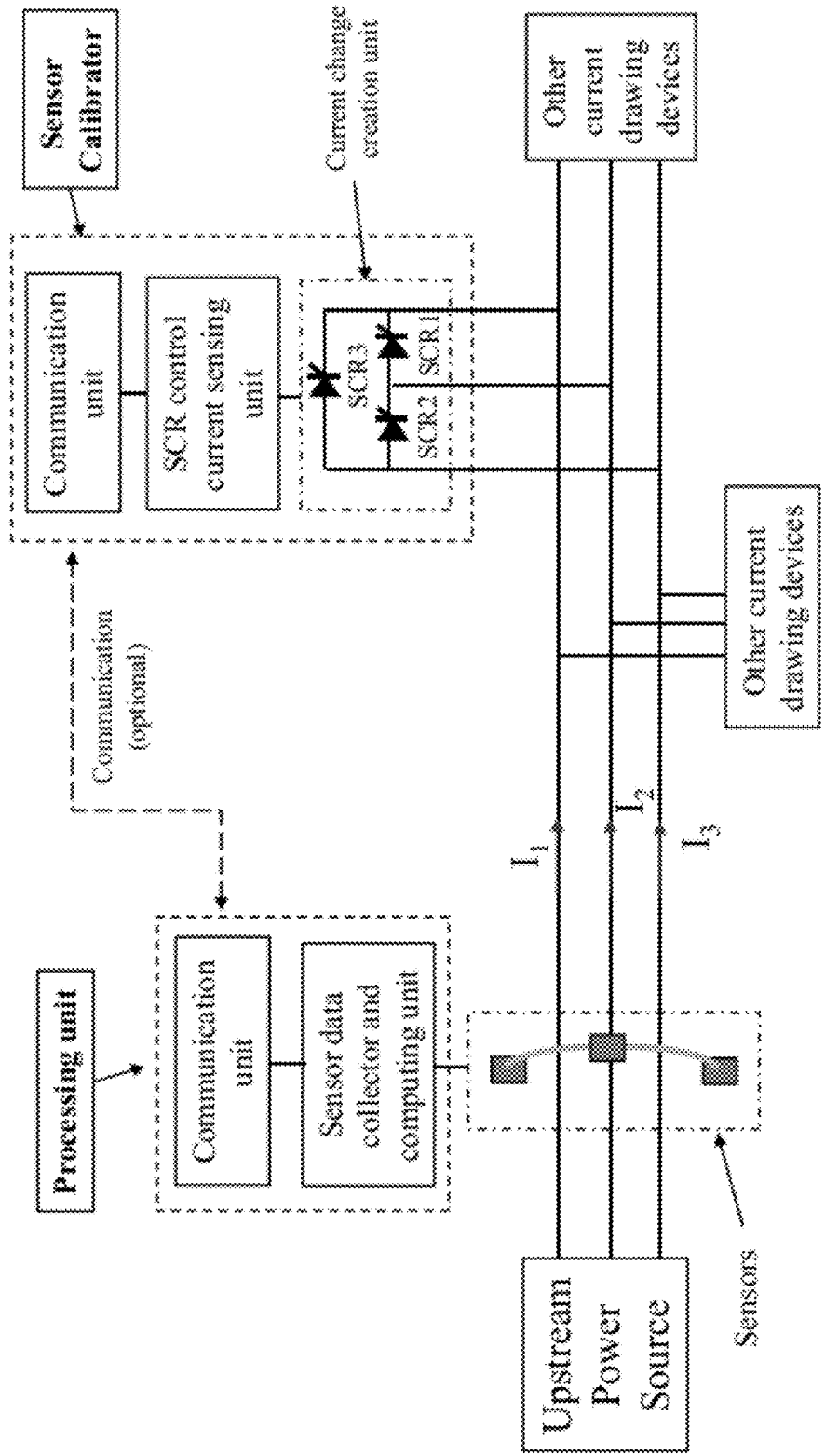
FIG. 3 is a block diagram of a current sensing system according to one aspect of the invention.

In the embodiment illustrated in FIG. 3, the current drawing device, called the sensor calibrator, is placed downstream of the sensors or with the sensors between the calibrator and the main source for the current. The currents to be measured by the sensors consist of the currents drawn by the calibrator and those of the devices connected to the circuits as follows:

$$[I][I_{calibrator}] + [I_{others}]$$

The calibrator is designed to create a sudden change in the current it draws. As a result, the change of the total circuit current is $$[\Delta I] = [\Delta I_{calibrator}]$$

In the above equation, it is assumed that the currents drawn by other devices remain the same when the calibrator changes the currents it draws. $[\Delta I_{calibrator}]$ are called the calibration currents. In some embodiments, the sensors can measure either the magnetic fields or the induced voltages. This leads to a linear relationship between the sensor outputs and the conductor currents. A sudden change of the conductor currents caused by calibrator will cause a sudden change on the sensor outputs. This results in the following relationship:

$$[\Delta S] = [K][\Delta I]$$

In the above equation, [ΔS] is measured by the sensing unit of the sensors and [ΔI] is known to the processing unit through means such as communications or pre-agreed protocols. It can be assumed that the calibrator creates several patterns of current change [ΔI] by drawing different amounts of currents from various conductors. The sensing unit of the sensors will therefore sense different outputs [ΔS]. The results are:

$$[\Delta S_{pattern1}, \Delta S_{pattern2}, \Delta S_{pattern3}] = [K]$$
$$[\Delta I_{pattern1}, \Delta I_{pattern2}, \Delta I_{pattern3}]$$

In the above equation, the calibrator is assumed to draw 3 different current patterns from the conductors. The above equation can be used to solve for [K] as follows:

$$[K] = [\Delta S_{pattern1}, \Delta S_{pattern2}, \Delta S_{pattern3}]$$
$$[\Delta I_{pattern1}, \Delta I_{pattern2}, \Delta I_{pattern3}]^{-1}$$

In general if there are N conductors in the circuit, a minimum of N sensors and a minimum of N current patterns are needed. More sensors and current patterns can be used to improve the accuracy of [K] estimate and thus the accuracy of current measurement.

Figure 4:
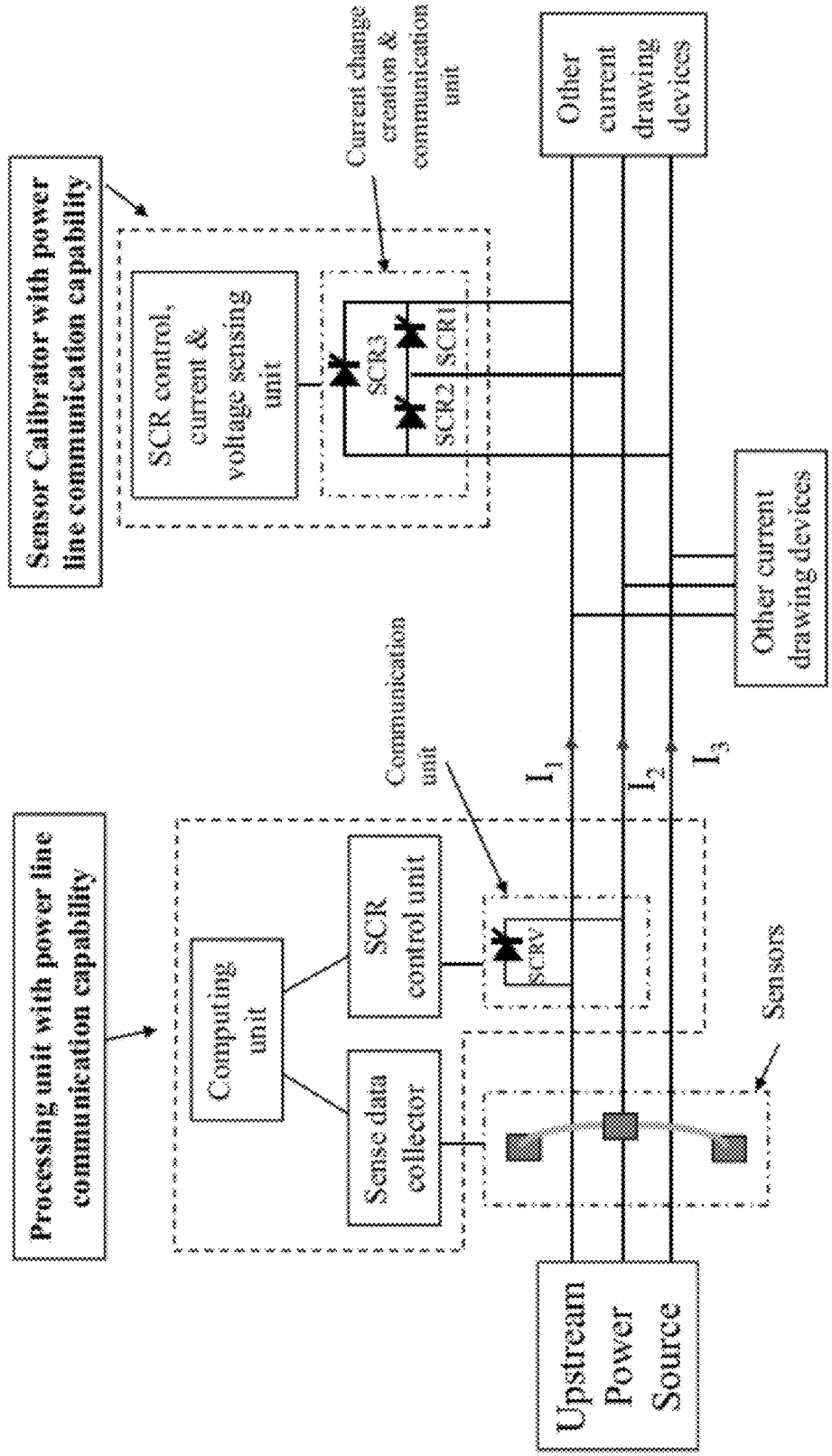
FIG. 4 is a block diagram of a variant of the invention according to another embodiment.

One implementation of the invention involves the use of thyristors (SCRs or silicon controlled rectifiers) for the sensor calibrator as shown in FIG. 4. FIG. 4 shows a sample case where only a total of three conductors are present. The thyristor connected between conductors 1 and 2 are fired first to create a current change pattern of $$[\Delta I_1 \, \Delta I_2 \, \Delta I_3]_{pattern1} = [-I_{SCR1} \, I_{SCR1} \, 0]$$

Figure 5:
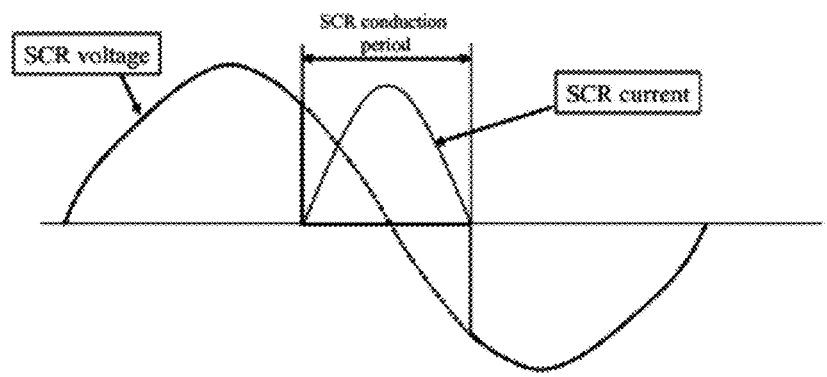
FIG. 5 is a waveform illustrating the operation of a SCR as used in one embodiment of the invention.

One of the preferred methods to create this current change is to let the SCRs conduct in one cycle and then to not let them conduct in the subsequent cycle. The difference of the currents between the two cycles is the current change. Similarly [ΔS] is determined by the subtracting one cycle of [S] from the [S] of the next cycle. Depending on the circuit impedance, a partially conducting SCR is often sufficient to generate a large calibration current. For example, SCR1 can be fired near the zero crossing point of its voltage waveform. This causes a controlled short-circuit and a large pulse current is drawn. This large pulse current is the calibration current (see FIG. 5). The firing angle of the SCR can be adjusted to change the magnitude of the current pulse. An impedance may also be connected in series with the SCR to limit the current.

The thyristor connected between conductors 2 and 3 are fired next to create a current change pattern of $$[\Delta I_1 \, \Delta I_2 \, \Delta I_3]_{pattern2} = [0 \, -I_{SCR2} \, I_{SCR2}]$$

The thyristor connected between conductors 1 and 3 are fired last to create a current change pattern of $$[\Delta I_1 \, \Delta I_2 \, \Delta I_3]_{pattern3} = [-I_{SCR2} \, 0 \, I_{SCR3}]$$

These three patterns are sufficient to solve for the matrix [K]. To create more current patterns, the thyristors' firing angles can be varied with the help of the SCR current sensing and control unit. More than three current patterns for this case will lead to a least square solution of the matrix [K].

The calibrator's SCR current sensing and control unit can also measure the currents it draws from the conductors, i.e. ISCR1, ISCR2 and ISCR3. The values of the currents can be communicated to the processing unit through the optional communication units of both devices. The means of communication includes wireless transceivers, power line signaling, or others. Alternatively, the firing angles of the thyristors may be controlled to produce precise current pulses with pre-established features. These features may be already programmed into the processing unit. Once the sensors detect the change in the conductor currents, the processing unit can solve for matrix [K] based on pre-agreed upon current change values.

Once the matrix [K] is determined, the calibration process is completed. The sensors can start to "measure" the conductor currents using the following equation:

$$[I]=[K]^{-1}[S]$$

where [S] is the quantities due to current flow and which are sensed by the sensors.

In summary, the example implementation of the calibration system explained above has the following components:

1. Sensory Calibrator:

This device generates the calibration currents of various characteristics during the calibration process. The characteristics of the calibration currents which may be adjusted include but are not limited to different patterns of calibration currents, different magnitudes of the currents, and different waveforms of the currents. When calibration is completed, the sensory calibrator becomes idle. The sensory calibrator may consist of the following subcomponents:

a) Current change creation unit: This unit is typically made of power electronic components such as SCRs that can draw currents from the conductors with desired characteristics.

b) Current sensing and control unit: This unit senses and controls the currents generated by the current change creation unit. This control unit determines which characteristics of the generated current are to be adjusted. For example, the conduction angles of the SCRs can be changed to form different current patterns and magnitudes.

c) Communication unit: This component communicates with the processing unit. The communication unit can perform functions such as:
(1) receiving the command to initiate the calibration process
(2) informing the sensors and/or the processing unit of the start/end of various current patterns
(3) informing the processing unit of the characteristics of the calibration currents,
(4) receiving and acknowledging of the end of calibration process.

2. Processing Unit.

This unit may be attached to and associated with the sensors and may be located near the sensors. The processing unit calculates the conductor currents based on the relationship between the sensor outputs and conductor currents. This is done regardless of whether the sensors measure magnetic field strength or voltages produced by these magnetic fields. In addition to the processing unit, other units which the processing unit interacts with and which are used in the calibration process may be the following:

a) Sensor data collector and computing unit: This component performs two functions during the calibration phase. It
(1) detects the starting and ending of the collaboration process,
(2) collects the sensed quantities and the calibrating currents received from the communication unit,
(3) solves for the relationship between [I] and [S], i.e. matrix [K] for the case of the linear relationship and
(4) stores the relationship for current measurement when the calibration process is done.

b) Communication unit: This component communicates with the sensor calibrator during the calibration process. It can perform functions such as
(1) initiating the calibration process,
(2) acknowledging the reception of features/values of the calibration currents,
(3) signaling the ending of the calibration process. The communication unit may communicate with the sensor calibrator using any suitable means of communication, including but not limited to wireless transceivers, power line signaling and others.

Figure 8:
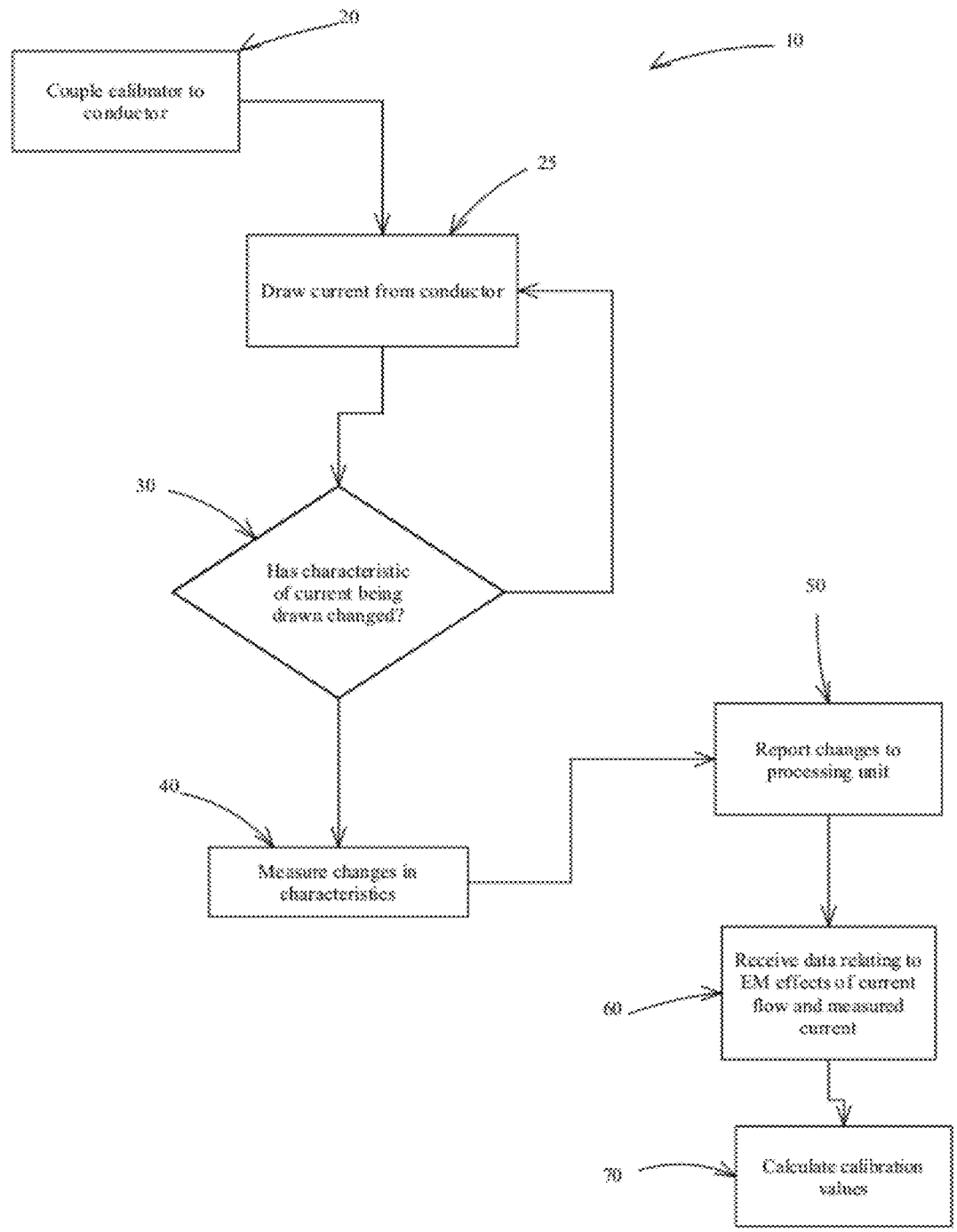
FIG. 8 is a flowchart detailing a calibration method according to one aspect of the invention.

Referring to FIG. 8, the calibration method mentioned above is illustrated in the flowchart 10. The method begins with step 20, that of coupling the calibrator to the conductor(s) being used. As noted above, the calibrator is coupled to the conductor(s) downstream of the sensors. Once coupled to the conductor(s), the calibrator then draws current from the conductor in known and predetermined manners (step 25). This may be in a prearranged and/or preprogrammed sequence. Step 30 determines if the calibrator has changed the characteristics of the current it draws from the conductor. If no changes are made, the drawing of current continues. If there are any changes, these changes in the characteristics of the current the calibrator draws from the conductors are, of course, measured by the calibrator (step 40). The changes are reported to a processing unit (step 50) by the calibrator. As noted above, the reporting may be done by communicating with the processing unit, whether the processing unit is part of the sensors or of the calibrator. The effects of current flow in the conductors, as measured by the sensors upstream of the calibration device, are also received (step 60) by the processing unit. As noted above, these measurements are taken at about the time the calibration device makes changes to the current it draws from the conductor. The processing unit receives these measurements regardless of whether the processing unit is part of the sensors or the calibration device. Based on these sets of data (the electromagnetic effects caused by the current flow as measured by the sensors, the calibrating currents measured by the calibration device, and the characteristics of the current drawn by the calibration device) the processing unit then calculates the calibration values (step 70). These calibration values can then be used when measuring current on the conductor at a later time.

It should be noted that the above implementation has many variations. In one variation, the sensor calibrator is one of the current drawing devices downstream of the sensors. As noted above, the calibrator device should be able to produce current changes and such changes should be measurable and can be communicated to the sensors or to the processing unit. An example is a power electronic based device such as an appliance or motor drive. The power electronic circuit of the device can be made to produce specific current changes. These changes are then used as calibrating currents.

In another variation, the communication units can be avoided by using a pre-established protocol for the calibration currents. For example, the sensor calibrator can be programmed to generate currents of pre-defined magnitudes, waveforms and other attributes within pre-established time periods. The sensors will perform calibration during those periods using pre-agreed characteristics of the calibration currents. This is an open loop system.

Figure 6:
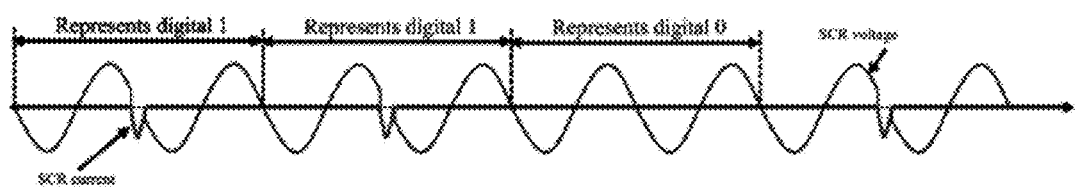
FIG. 6 is a waveform illustrating how SCR current pulses can be used as a single direction communication system in a variant of the invention.

A third variation is one in which the sensor calibrator also serves as a power line communication device. In this case, the patterns of calibration currents not only help to calibrate the sensors but also carry information about the characteristics of the currents produced by calibrator. For example, SCR1 can be fired in a specific sequence that represents digital information (FIG. 6). In this variant, this sequence of current pulses will be sensed, at the sensor array location, as a sequence of pulses of sensed quantifies such as pulses of magnitude fields or pulses of induced voltages. The sequence can be decoded to obtain information coded by the sensor calibrator. This is a one way communication system.

Figure 7:
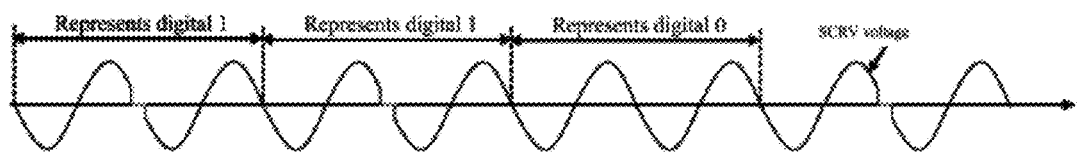
FIG. 7 is a waveform illustrating how voltage dips can be used in a two way communication scheme according to another variant of the invention.

Another variant is possible if one of the voltages between the conductors is accessible to the sensors and its attendant units (including the processing unit). If such is possible, a two way power line communication scheme can be constructed by adding a SCR to the sensor device as shown in FIG. 4. This SCR, labelled as SCRV, can be triggered by the SCR control unit of the sensors to conduct in a sequence that presents digital information. Once the SCR conducts, the voltage of the SCR collapses to zero. (An impedance may be connected in series of the SCR to moderate the severity of the voltage dip). This voltage dip can be detected at any location downstream of the SCRV. These voltage dips can then be detected by the sensor calibrator and their meaning can thus be decoded (FIG. 7). In this way, the sensors can communicate with the sensor calibrator using the power line. This forms a two way communication system between the calibrator and the sensors.

It should also be noted that the above described scheme is also applicable to the case of a single conductor and single sensor. In this case, the matrix equation becomes a scalar equation $S=KI$. The calibrator can be then be used to help in determining K. The preferred embodiment of the invention would use multiple sensors but, as noted above, the method of the invention may also be used with as few as a single sensor. The equations used in the multiple sensor embodiment may be adjusted accordingly if only a single sensor is being used.

The method steps of the invention may be embodied in sets of executable machine code stored in a variety of formats such as object code or source code. Such code is described generically herein as programming code, or a computer program for simplification. Clearly, the executable machine code may be integrated with the code of other programs, implemented as subroutines, by external program calls or by other techniques as known in the art.

The embodiments of the invention may be executed by a computer processor or similar device programmed in the manner of method steps, or may be executed by an electronic system which is provided with means for executing these steps. Similarly, an electronic memory means such computer diskettes, CD-Roms, Random Access Memory (RAM), Read Only Memory (ROM) or similar computer software storage media known in the art, may be programmed to execute such method steps. As well, electronic signals representing these method steps may also be transmitted via a communication network.

Embodiments of the invention may be implemented in any conventional computer programming language For example, preferred embodiments may be implemented in a procedural programming language (e.g. "C") or an object oriented language (e.g. "C++"). Alternative embodiments of the invention may be implemented as pre-programmed hardware elements, other related components, or as a combination of hardware and software components. Embodiments can be implemented as a computer program product for use with a computer system. Such implementations may include a series of computer instructions fixed either on a tangible medium, such as a computer readable medium (e.g., a diskette, CD-ROM, ROM, or fixed disk) or transmittable to a computer system, via a modem or other interface device, such as a communications adapter connected to a network over a medium. The medium may be either a tangible medium (e.g., optical or electrical communications lines) or a medium implemented with wireless techniques (e.g., microwave, infrared or other transmission techniques). The series of computer instructions embodies all or part of the functionality previously described herein. Those skilled in the art should appreciate that such computer instructions can be written in a number of programming languages for use with many computer architectures or operating systems. Furthermore, such instructions may be stored in any memory device, such as semiconductor, magnetic, optical or other memory devices, and may be transmitted using any communications technology, such as optical, infrared, microwave, or other transmission technologies. It is expected that such a computer program product may be distributed as a removable medium with accompanying printed or electronic documentation (e.g., shrink wrapped software), preloaded with a computer system (e.g., on system ROM or fixed disk), or distributed from a server over the network (e.g., the Internet or World Wide Web). Of course, some embodiments of the invention may be implemented as a combination of both software (e.g., a computer program product) and hardware. Still other embodiments of the invention may be implemented as entirely hardware, or entirely software (e.g., a computer program product).

A person understanding this invention may now conceive of alternative structures and embodiments or variations of the above all of which are intended to fall within the scope of the invention as defined in the claims that follow.

Having thus described the invention, what is claimed as new and secured by Letters Patent is:

1. A system for calibrating an electrical current measuring device which measures electrical currents passing through a plurality of conductors, the system comprising:
   a calibration device configured to selectively draw electrical current from more than one conductor in said plurality of conductors, said calibration device adjusting said electrical current it draws from said more than one conductor in said plurality of conductors in a controlled manner, said calibration device also measuring changes in said electrical current it draws from said more than one conductor said plurality of conductors, said device being electrically coupled to said plurality of conductors downstream of a plurality of electromagnetic effect sensors of said electrical current measuring device, each of said plurality of electromagnetic sensors being configured to measure a combined electromagnetic effect of said currents passing through all of said plurality of conductors;
   a processing unit for determining a relationship between an output of each of said plurality of electromagnetic effect sensors and currents in said plurality of conductors, said relationship being calculated based on said changes in said electrical current drawn by said calibration device and said output of each of said plurality of electromagnetic effect sensors as said combined electromagnetic effects of said currents are measured by said plurality of electromagnetic effect sensors; and
   wherein
   said current measuring device communicates its measurements to said processing unit;
   each of said plurality of conductors is parallel to one another; and
   said plurality of conductors are bundled together.

2. A system according to claim 1, wherein said calibration device further comprises said processing unit.

3. A system according to claim 1, wherein said calibration device communicates wirelessly with said processing unit.

4. A system according to claim 1, wherein said calibration device communicates with said processing unit using patterns of current pulses drawn by said calibration device.

5. A system according to claim 1, wherein said processing unit communicates with said calibration device using patterns of voltage pulses in said more than one conductor, said voltage pulses being created by said processing unit.

6. A system according to claim 1, wherein said calibration device adjusts said electrical current it draws from said more than one conductor in a prearranged manner.

7. A system according to claim 6, wherein said calibration device adjusts said electrical current it draws from said more than one conductor in discrete, prearranged and predetermined increments.

8. A system according to claim 1, wherein said changes to said electrical current being drawn by said calibration device are pulses.

9. The system according to claim 1, wherein each of said plurality of conductors is individually inaccessible for measuring an individual electromagnetic effect of each of said plurality of conductors.

10. The system according to claim 1, wherein said plurality of conductors provides said currents to other devices downstream of said electrical current measuring device while calibration occurs.

11. A method for calibrating an electrical current measuring device which measures electrical currents passing through a plurality of conductors, the method comprising:
   a) locating a calibration device adjacent said plurality of conductors, said calibration device being configured to draw electrical current from more than one conductor in said plurality of conductors, said calibration device also being for adjusting, in a controlled manner, said electrical current being drawn from said more than one conductor in said plurality of conductors;
   b) adjusting said electrical current drawn by said calibration device from said more than one conductor in said plurality of conductors;
   c) providing a measurement of said electrical current adjusted in step b) to a processing unit;
   d) concurrent with step b), collecting data from each of a plurality of electromagnetic effect sensors, each of said plurality of electromagnetic sensors measuring a combined electromagnetic effect of currents passing through all of said plurality of conductors;
   e) repeating steps b) to d) until sufficient measurements have been obtained; and
   f) calculating a relationship between an output of each of said plurality of electromagnetic effect sensors and said currents in each of said plurality of conductors based on said measurements and data obtained in steps b) and d), said relationship being calculated based on said measurements of said electrical current adjusted in step b) and said data from each of said plurality of electromagnetic effect sensors collected in step d); and
   wherein each of said plurality of conductors is parallel to one another and said plurality of conductors are bundled together.

12. A method according to claim 11, wherein step d) is executed by a processing unit.

13. A method according to claim 12, wherein measurements provided in step c) are received wirelessly by said processing unit.

14. A method according to claim 11, wherein said calibration device communicates with said processing unit using patterns of current pulses drawn by said calibration device.

15. A method according to claim 11, wherein said processing unit communicates with said calibration device using patterns of voltage pulses in said more than one conductor, said voltage pulses being created by said processing unit.

16. A method according to claim 11, wherein said calibration device adjusts said electrical current it draws from said more than one conductor in a prearranged manner.

17. A method according to claim 16, wherein said calibration device adjusts said electrical current it draws from said more than one conductor in discrete, prearranged and predetermined increments.

18. A method according to claim 11, wherein said changes to said electrical current being drawn by said calibration device are pulses.

19. The method according to claim 11, wherein each of said plurality of conductors is individually inaccessible for measuring an individual electromagnetic effect of each of said plurality of conductors.

20. The method according to claim 11, wherein said plurality of conductors provides said currents to other devices downstream of said electrical current measuring device while calibration occurs.

* * * * *